United States Patent
Kim et al.

(10) Patent No.: US 11,158,837 B2
(45) Date of Patent: Oct. 26, 2021

(54) DISPLAY APPARATUS HAVING A THIN-FILM ENCAPSULATION LAYER

(71) Applicant: SAMSUNG DISPLAY CO., LTD., Yongin-si (KR)

(72) Inventors: Younggu Kim, Yongin-si (KR); Jiyun Park, Yongin-si (KR); Jongmin Ok, Yongin-si (KR); Byoungduk Lee, Yongin-si (KR); Taekjoon Lee, Yongin-si (KR); Sunyoung Chang, Yongin-si (KR); Hyelim Jang, Yongin-si (KR); Baekkyun Jeon, Yongin-si (KR); Jinsoo Jung, Yongin-si (KR); Kyungseon Tak, Yongin-si (KR); Jaeheung Ha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/858,063

(22) Filed: Apr. 24, 2020

(65) Prior Publication Data

US 2021/0028395 A1    Jan. 28, 2021

(30) Foreign Application Priority Data

Jul. 22, 2019    (KR) .................. 10-2019-0088521

(51) Int. Cl.
*H01L 51/52*    (2006.01)
*H01L 27/32*    (2006.01)

(52) U.S. Cl.
CPC ........ *H01L 51/5253* (2013.01); *H01L 27/323* (2013.01)

(58) Field of Classification Search
CPC .................................................. H01L 51/5253
USPC .......................................................... 257/40
See application file for complete search history.

(56) References Cited

U.S. PATENT DOCUMENTS

| | | | |
|---|---|---|---|
| 7,362,515 B2 | 4/2008 | Miyazawa | |
| 9,276,235 B2 | 3/2016 | Noh | |
| 2007/0086091 A1* | 4/2007 | Sawanobori | G02B 27/0006 359/582 |
| 2013/0168712 A1* | 7/2013 | Jeong | H01L 51/5275 257/98 |
| 2015/0047969 A1 | 2/2015 | Lee et al. | |
| 2015/0301667 A1* | 10/2015 | Yano | G06F 3/0445 345/173 |

(Continued)

FOREIGN PATENT DOCUMENTS

| | | |
|---|---|---|
| JP | 2004315572 A * | 11/2004 |
| JP | 4656074 | 3/2011 |

(Continued)

*Primary Examiner* — Ajay Arora
(74) *Attorney, Agent, or Firm* — F. Chau & Associates, LLC

(57) ABSTRACT

A display apparatus includes a substrate comprising a display area and a non-display area. A light-emitting device is on the display area. A thin-film encapsulation layer is on the light-emitting device. The thin-film encapsulation layer includes at least one inorganic encapsulation layer and at least one organic encapsulation layer. The organic encapsulation layer includes a plurality of organic particles having a core-shell structure that includes a hollow core and a shell surrounding the hollow core. A touch unit is on the thin-film encapsulation layer.

21 Claims, 9 Drawing Sheets

(56) References Cited

U.S. PATENT DOCUMENTS

| | | | |
|---|---|---|---|
| 2015/0346866 A1* | 12/2015 | Kusunoki | G06F 3/04166 |
| | | | 345/174 |
| 2017/0018741 A1* | 1/2017 | Osawa | H01L 51/5268 |
| 2017/0075492 A1 | 3/2017 | Kim et al. | |
| 2017/0163067 A1* | 6/2017 | Altman | H02J 7/00 |
| 2018/0033830 A1 | 2/2018 | Kim et al. | |
| 2020/0210005 A1* | 7/2020 | Kim | G06F 3/0412 |

FOREIGN PATENT DOCUMENTS

| KR | 10-2015-0034053 | 4/2015 |
|---|---|---|
| KR | 10-2017-0032953 | 3/2017 |
| KR | 10-2018-0014398 | 2/2018 |

* cited by examiner

DISPLAY APPARATUS HAVING A THIN-FILM ENCAPSULATION LAYER

CROSS-REFERENCE TO RELATED APPLICATION

This application claims priority under 35 U.S.C. § 119 to Korean Patent Application No. 10-2019-0088521, filed on Jul. 22, 2019, in the Korean Intellectual Property Office, the disclosure of which is incorporated by reference in its entirety herein.

TECHNICAL FIELD

One or more embodiments relate to display apparatuses, and more particularly, to a display apparatus having a reduced thickness and an improved touch sensitivity.

DISCUSSION OF RELATED ART

Various display apparatuses are being developed for use in multimedia apparatuses, such as televisions, mobile phones, tablet computers, navigation devices, and video game devices. The display apparatuses may include various input devices, such as a keyboard, a mouse, a touch unit, etc. However, in display apparatuses having a touch unit arranged directly on the display unit, a sensitivity of the touch unit may be reduced by a parasitic capacitance between the display unit and the touch unit.

SUMMARY

Provided is a display apparatus having a reduced thickness and also providing improved touch sensitivity. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure According to one or more exemplary embodiments, a display apparatus includes a substrate comprising a display area and a non-display area. A light-emitting device is on the display area. A thin-film encapsulation layer is on the light-emitting device. The thin-film encapsulation layer includes at least one inorganic encapsulation layer and at least one organic encapsulation layer. The organic encapsulation layer includes a plurality of organic particles having a core-shell structure that includes a hollow core and a shell surrounding the hollow core. A touch unit is on the thin-film encapsulation layer.

The organic encapsulation layer may have permittivity of 2.6 or less.

The organic encapsulation layer may have a refractive index of 1.4 or less.

The shell may include a high molecular weight material.

The shell may include at least one selected from an acrylic polymer, polyimide, an urethane polymer, a styrene-based polymer, a siloxane-based polymer, an epoxy-based polymer, and a combination thereof.

A surface of the shell may be electrically neutral.

No charged particles may be omitted from the surface of the shell.

A thickness of the shell may be about 5 nm to about 50 nm.

A diameter of the organic particle may be about 10 nm to about 200 nm.

The organic encapsulation layer may include a monomer-based organic material, and the organic particle may be included in the organic encapsulation layer at a percentage of about 10% to about 80%.

The touch unit may be arranged directly on the thin-film encapsulation layer, and the touch unit may include a detection electrode arranged on the display area, and a signal line arranged on the non-display area and connected to the detection electrode.

The detection electrode may have a mesh shape.

The detection electrode may include a first detection electrode and a second detection electrode, and the signal line may include a first signal line connected to the first detection electrode and a second signal line connected to the second detection electrode.

The detection electrode may include a first conductive layer, a second conductive layer on the first conductive layer, a first insulating layer between the first conductive layer and the second conductive layer, and a second insulating layer on the second conductive layer.

The first conductive layer and the second conductive layer may be electrically connected to each other via a contact hole defined in the first insulating layer.

A distance between the first conductive layer and the opposite electrode may be about 5 µA to about 20 µm.

According to one or more exemplary embodiments, a display apparatus includes a substrate. A pixel electrode is on the substrate. An intermediate layer is arranged on the pixel electrode and comprises an emission layer. An opposite electrode is on the intermediate layer. A thin-film encapsulation layer is on the opposite electrode and comprises an inorganic encapsulation layer and an organic encapsulation layer located on the inorganic encapsulation layer. The organic encapsulation layer has a permittivity of about 2.6 or less. A touch unit is directly on the thin-film encapsulation layer and comprises a conductive layer configured to detect an external input.

The organic encapsulation layer may include an organic particle having a core-shell structure including a hollow core and a shell around the hollow core.

The organic particle may include at least one selected from an acrylic polymer, polyimide, an urethane polymer, a styrene-based polymer, a siloxane-based polymer, an epoxy-based polymer, and a combination thereof.

The organic encapsulation layer may have a refractive index of 1.4 or less.

According to one or more exemplary embodiments, a thin-film encapsulation layer for a display apparatus includes at least one inorganic encapsulation layer and at least one organic encapsulation layer. The at least one organic encapsulation layer includes an organic encapsulation material comprising a monomer-based organic material. The at least one organic encapsulation layer further includes a plurality of organic particles having a core-shell structure that includes a hollow core and a shell surrounding the hollow core. The organic particles are included in the organic encapsulation layer at a percentage of about 10% to about 80% of a volume of the organic encapsulation material.

These and/or other aspects will become apparent and more readily appreciated from the following description of the exemplary embodiments, the claims, and the accompanying drawings.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION OF THE EXEMPLARY EMBODIMENTS

Figure 1:
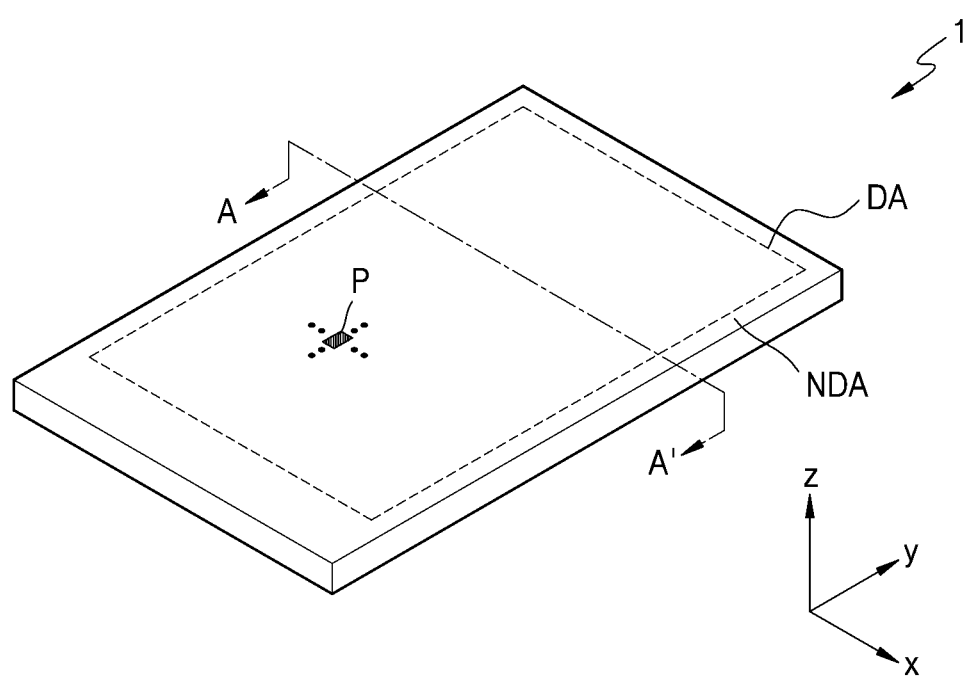
FIG. 1 is a perspective view of a display apparatus according to an exemplary embodiment of the present inventive concepts.

As the disclosure allows for various changes and numerous embodiments, particular exemplary embodiments will be illustrated in the drawings and described in detail in the written description. Hereinafter, effects and features of the present disclosure and a method for accomplishing them will be described more fully with reference to the accompanying drawings, in which exemplary embodiments of the present inventive concepts are shown. The present inventive concepts may, however, be embodied in many different forms and should not be construed as limited to the exemplary embodiments set forth herein.

One or more exemplary embodiments of the present inventive concepts will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

A certain exemplary embodiment may be implemented differently. For example, a specific process order may be performed differently from the described order. For instance, two consecutively described processes may be performed substantially at the same time or performed in an order that is opposite to the described order.

In the present specification, "A and/or B" represents A or B, or A and B. The expression "at least one of A and B" indicates only A, only B, both A and B, or variations thereof.

It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to an exemplary embodiment of the present inventive concepts.

Referring to FIG. 1, the display apparatus 1 includes a display area DA for displaying an image, and a non-display area NDA in which images are not displayed. The non-display area NDA may be disposed around the periphery of the display area DA (e.g., in the X and/or Y directions). In the exemplary embodiment shown in FIG. 1, the non-display area NDA surrounds four sides of the display area DA. However, in other exemplary embodiments, the non-display area NDA may surround three or less sides of the display area DA. The display apparatus 1 may provide an image by using light emitted by a plurality of pixels P arranged in the display area DA.

Although an organic light-emitting display apparatus will now be illustrated and described as the display apparatus 1 exemplary embodiments of the present inventive concepts are not limited thereto. For example, in another exemplary embodiment, the display apparatus 1 may be an inorganic light-emitting display, a quantum dot light-emitting display, etc. For example, an emission layer of a display element included in the display apparatus 1 may include an organic material, an inorganic material, quantum dots, an organic material and quantum dots, an inorganic material and quantum dots, etc.

Although the exemplary embodiment of FIG. 1 illustrates a display apparatus 1 having a flat display surface, exemplary embodiments of the present inventive concepts are not limited thereto. For example, in another exemplary embodiment of the present inventive concepts, the display apparatus 1 may include a three-dimensional display surface or a curved display surface.

In exemplary embodiments in which the display apparatus 1 includes a three-dimensional display surface, the display apparatus 1 may include a plurality of display areas oriented in different directions. For example, the display apparatus 1 may include a display surface in the form of a polyprism. In an exemplary embodiment in which the display apparatus 1 includes a curved display surface, the display apparatus 1 may be implemented in various forms, including flexible, foldable, and rollable display apparatuses.

As shown in the exemplary embodiment of FIG. 1, the display apparatus 1 may be a mobile phones. The mobile phone may include electronic modules, a camera module, a power supply module, and the like mounted on a main board and arranged in a bracket/case or the like together with the display apparatus 1. However, in other exemplary embodiments of the present inventive concepts, the display apparatus 1 may be large-sized electronic apparatuses, such as televisions and monitors, or other small- and medium-sized electronic apparatuses, such as tablets, automobile navigation devices, game players, smart watches, etc.

In the exemplary embodiment shown in FIG. 1, the display area DA of the display apparatus 1 is rectangular. However, in other exemplary embodiments, the shape of the display area DA may be a circle, an oval, a polygon such as a triangle or a pentagon, etc.

Figure 2:
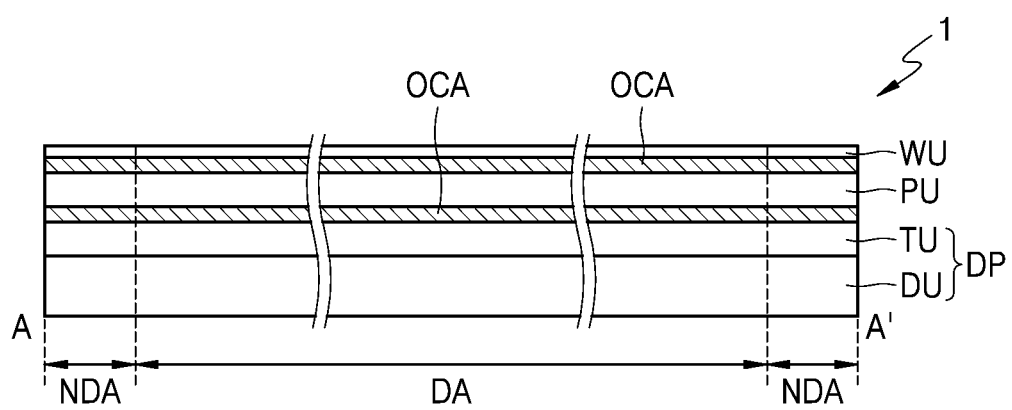
FIG. 2 is a cross-sectional view taken along line A-A' of FIG. 1 of the display apparatus according to an exemplary embodiment of the present inventive concepts.

FIG. 2 is a cross-sectional view taken along line A-A' of FIG. 1 of the display apparatus according to an exemplary embodiment of the present inventive concepts. FIG. 2 is a simplified cross-sectional view for explaining a stacking relationship between a functional panel and/or functional units that constitute the display apparatus 1.

As shown in the exemplary embodiment of FIG. 2, the display apparatus 1 may include a display unit DU (e.g., a display layer), a touch unit TU, a polarization unit PU, and a window unit WU. At least some components among the display unit DU, the touch unit TU, the polarization unit PU, and the window unit WU may be formed by consecutive processes or may be combined with each other via an adhesion member. FIG. 2 illustrates an optical transparent adhesion member OCA as the adhesion member. An adhesion member to be described hereinafter may include any adhesive known in the relevant art. In some exemplary embodiments, the polarization unit PU and the window unit WU may be replaced by other components or may be omitted altogether.

In an exemplary embodiment of the present inventive concepts, the touch unit TU is arranged directly on the display unit DU. In the present specification, the sentence "A component B is arranged directly on a component A" means that there are no adhesion layers/adhesion members being arranged between the components A and B. For example, the component B may be formed on a base surface of the component A via a consecutive process after the component A is formed.

Both the display unit DU and the touch unit TU arranged directly on the display unit DU may be defined as a display panel DP. As shown in the exemplary embodiment of FIG. 2, optical transparent adhesion members OCA may be arranged between the display panel DP and the polarization unit PU and between the polarization unit PU and the window unit WU, respectively (e.g., in the Z direction).

The display unit DU generates an image, and the touch unit TU obtains coordinate information of an external input (e.g., a touch event, etc.). In an exemplary embodiment, the display panel DP may further include a protection member arranged on a lower surface of the display unit DU. The protection member and the display unit DU may be combined with each other via an adhesion member.

The display unit DU according to an exemplary embodiment may be a light-emission display panel, but is not limited particularly. For example, in an exemplary embodiment, the display unit DU may be an organic light-emission display panel or a quantum dot light-emission display panel. An emission layer of an organic light-emission display panel may include an organic light-emission material. An emission layer of a quantum dot light-emission display panel may include quantum dots, quantum rods, and the like. For convenience of explanation, the display unit DU as an organic light-emission display panel will be described herein.

The polarization unit PU reduces reflectivity of external light that is incident thereon from the top of the window unit WU. In an exemplary embodiment of the present inventive concepts, the polarization unit PU may include a phase retarder and a polarizer. The phase retarder may be of a film type or liquid coating type and may include a $\lambda/2$ phase retarder and/or a $\lambda/4$ phase retarder. The polarizer may also be of a film type or liquid coating type. The film type may include a stretch-type synthetic resin film, and the liquid coating type may include liquid crystals arranged in a predetermined arrangement. The phase retarder and the polarizer may further include protective films, respectively. The phase retarder and the polarizer, or the protection film may be defined as a base layer of the polarization unit PU.

Structures of the display unit DU and the touch unit TU will now be described in detail.

Figure 3:
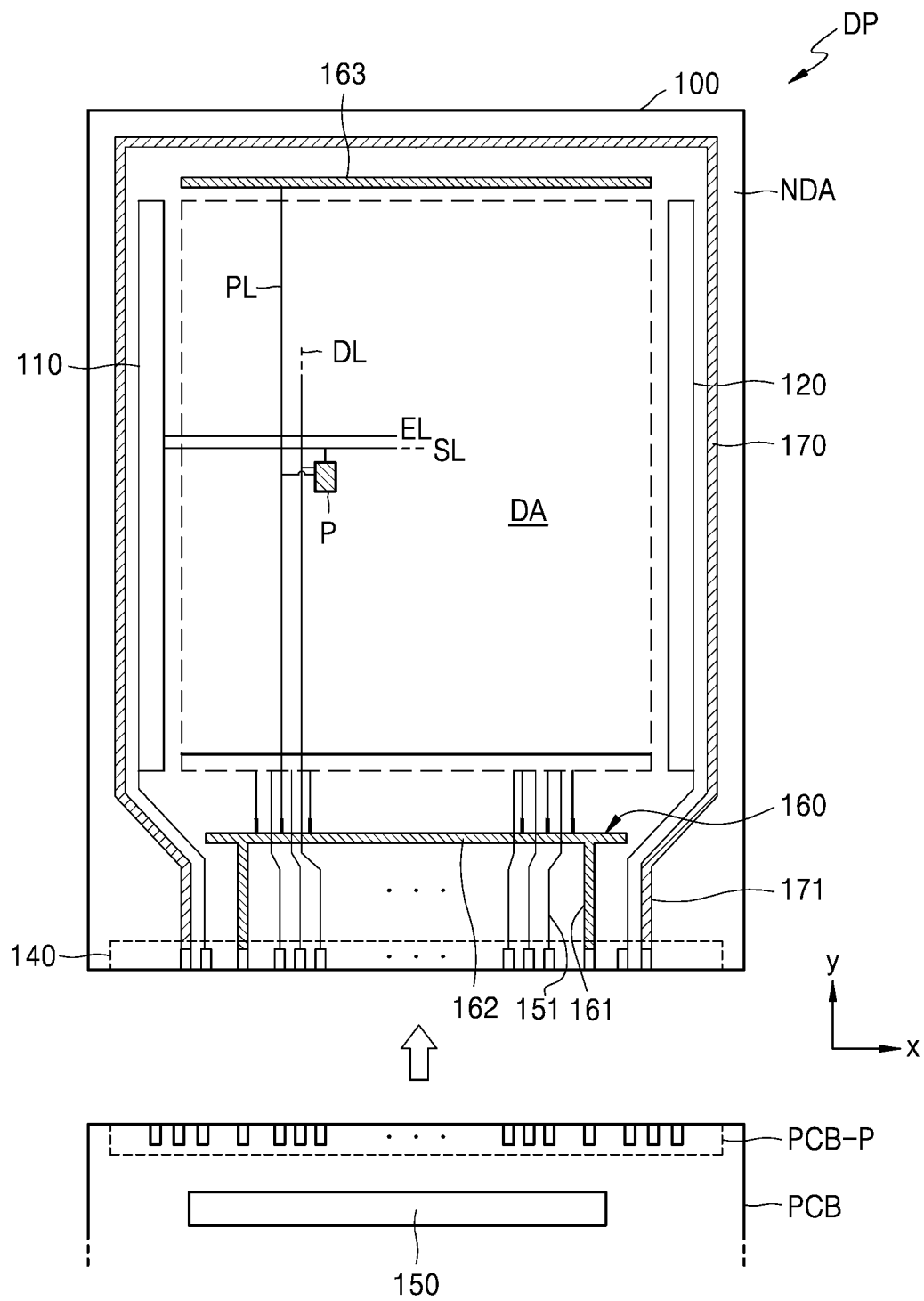
FIG. 3 is a top plan view of a portion of a display apparatus according to an exemplary embodiment of the present inventive concepts.

FIG. 3 is a top plan view of a portion of a display apparatus according to an exemplary embodiment of the present inventive concepts.

Referring to FIG. 3, the display panel DP includes a plurality of pixels P arranged in the display area DA. However, the simplified drawing of FIG. 3 illustrates a single pixel P. Each of the plurality of pixels P may include a display element, such as an organic light-emitting diode OLED. Each of the plurality of pixels P may emit, for example, red light, green light, blue light, or white light from the organic light-emitting diode OLED. However, in other exemplary embodiments, the pixels may emit other colors. The pixel P used herein may be understood as a pixel that emits one of red light, green light, blue light, and white light as described above. The display area DA may be covered with a thin-film encapsulation layer TFE (see FIG. 5) to protect the display area from contaminants, such as the ambient air, moisture, etc.

Each of the plurality of pixels P may be electrically connected to outer circuits arranged in the non-display area NDA. In the exemplary embodiment shown in FIG. 3, the non-display area NDA may include a first scan driving circuit 110, a second scan driving circuit 120, a pad unit 140, a data driving circuit 150, a first power supply line 160, and a second power supply line 170.

The first scan driving circuit 110 may provide a scan signal to each of the plurality of pixels P via a scan line SL. As shown in the exemplary embodiment of FIG. 3, the scan line SL may extend in the X direction. However, exemplary embodiments of the present inventive concepts are not limited thereto. The first scan driving circuit 110 may provide a light-emission control signal to each of the plurality of pixels P via a light-emission control line EL. In an exemplary embodiment, the emission control line EL may extend in the X direction and may be spaced apart from the scan line SL in the Y direction. However, exemplary embodiments of the present inventive concepts are not limited thereto. The second scan driving circuit 120 may be arranged side by side with the first scan driving circuit 110 with the display area DA therebetween. For example, as shown in the exemplary embodiment of FIG. 3, the first scan driving circuit 110 and the second scan driving circuit 120 may be arranged on a left side and a right side of the non-display area NDA, respectively, and are spaced apart in the X direction. However, exemplary embodiments of the present inventive concepts are not limited thereto. In an exemplary embodiment, some of the plurality of pixels P arranged in the display area DA may be electrically connected to the first scan driving circuit 110, and the remaining ones of the pixels P may be connected to the second scan driving circuit 120. However, in other exemplary embodiments, the second scan driving circuit 120 may be omitted.

The pad unit 140 may be arranged on one side of a substrate 100. For example, as shown in the exemplary embodiment of FIG. 3, the pad unit 140 may be arranged on a lower side (e.g., in the Y direction) of the display panel DP. In an exemplary embodiment, the pad unit 140 may be exposed by not being covered by an insulating layer and may be electrically connected to a printed circuit board PCB. A pad unit PCB-P of the printed circuit board PCB may be electrically connected to the pad unit 140 of the display apparatus 1. The printed circuit board PCB transmits a signal or power of a controller to the display apparatus 1.

A control signal generated by the controller may be transmitted to each of the first and second scan driving circuits 110 and 120 via the printed circuit board PCB. The controller may provide a first power, such as the first power supply voltage ELVDD of FIG. 4, and the second power, such as the second power supply voltage ELVSS of FIG. 4, to the first and second power supply lines 160 and 170 via first and second connection lines 161 and 171, respectively. The first power supply voltage ELVDD may be provided to each of the plurality of pixels P via a driving voltage line PL connected to the first power supply line 160, and the second power supply voltage ELVSS may be provided to an opposite electrode of each of the plurality of pixels P connected to the second power supply line 170.

The data driving circuit 150 is electrically connected to a data line DL. For example, as shown in the exemplary embodiment shown in FIG. 3, the data line DL may extend in the Y direction. However, exemplary embodiments of the present inventive concepts are not limited thereto. A data signal of the data driving circuit 150 may be provided to each of the plurality of pixels P via a connection line 151 connected to the pad unit 140 and the data line DL connected to the connection line 151. FIG. 3 illustrates an arrangement in which the data driving circuit 150 is disposed on the printed circuit board PCB. However, in another exemplary embodiment, the data driving circuit 150 may be arranged on the substrate 100. For example, the data driving circuit 150 may be disposed between the pad unit 140 and the first power supply line 160 (e.g., in the Y direction).

The first power supply line 160 may include a first sub-wire 162 and a second sub-wire 163 each extending in an x direction and being parallel to each other and spaced apart in the Y direction with the display area DA therebetween. For example, the first sub-wire 162 may be disposed on a bottom portion of the non-display area (e.g., in the Y direction) and the second sub-wire 163 may be disposed on a top portion of the non-display area (e.g., in the Y direction). However, exemplary embodiments of the present inventive concepts are not limited thereto. The second power supply line 170 may partially surround the display area DA by having a loop shape of which one side is open.

Figure 4:
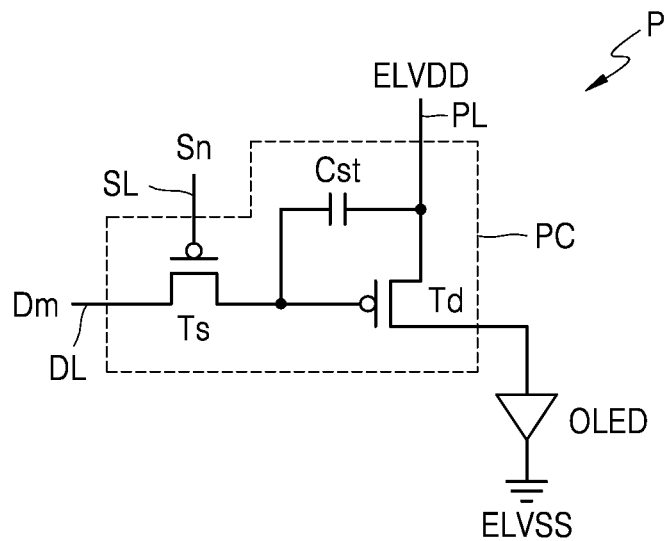
FIG. 4 is an equivalent circuit diagram of a pixel that may be included in a display apparatus according to an exemplary embodiment of the present inventive concepts.

FIG. 4 is an equivalent circuit diagram of a pixel that may be included in a display apparatus according to an exemplary embodiment of the present inventive concepts.

Referring to FIG. 4, each pixel P includes a pixel circuit PC connected to a scan line SL and a data line DL, and an organic light-emitting diode OLED connected to the pixel circuit PC.

The pixel circuit PC includes a driving thin-film transistor (TFT) Td, a switching TFT Ts, and a storage capacitor Cst. The switching TFT Ts is connected to the scan line SL and the data line DL, and transmits a data signal Dm to the driving TFT Td that is received via the data line DL according to a scan signal Sn received via the scan line SL.

The storage capacitor Cst is connected to the switching TFT Ts and a driving voltage line PL, and stores a voltage corresponding to a difference between a voltage received from the switching TFT Ts and the first power supply voltage ELVDD (or a driving voltage) supplied to the driving voltage line PL.

The driving TFT Td is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness according to the driving current.

Although the exemplary embodiment of FIG. 4 shows an embodiment in which the pixel circuit PC includes two TFTs and one storage capacitor, exemplary embodiments of the present inventive concepts are not limited thereto. For example, in other exemplary embodiments, the pixel circuit PC may include seven TFTs and one storage capacitor. However, exemplary embodiments of the present inventive concepts are not limited thereto. For example, in another exemplary embodiment, the pixel circuit PC may include two or more storage capacitors. Furthermore, while the exemplary embodiment of FIG. 4 shows the TFTs as having a single gate structure, in other exemplary embodiments at least one of the TFTs may have a dual gate structure, etc.

Figure 5:
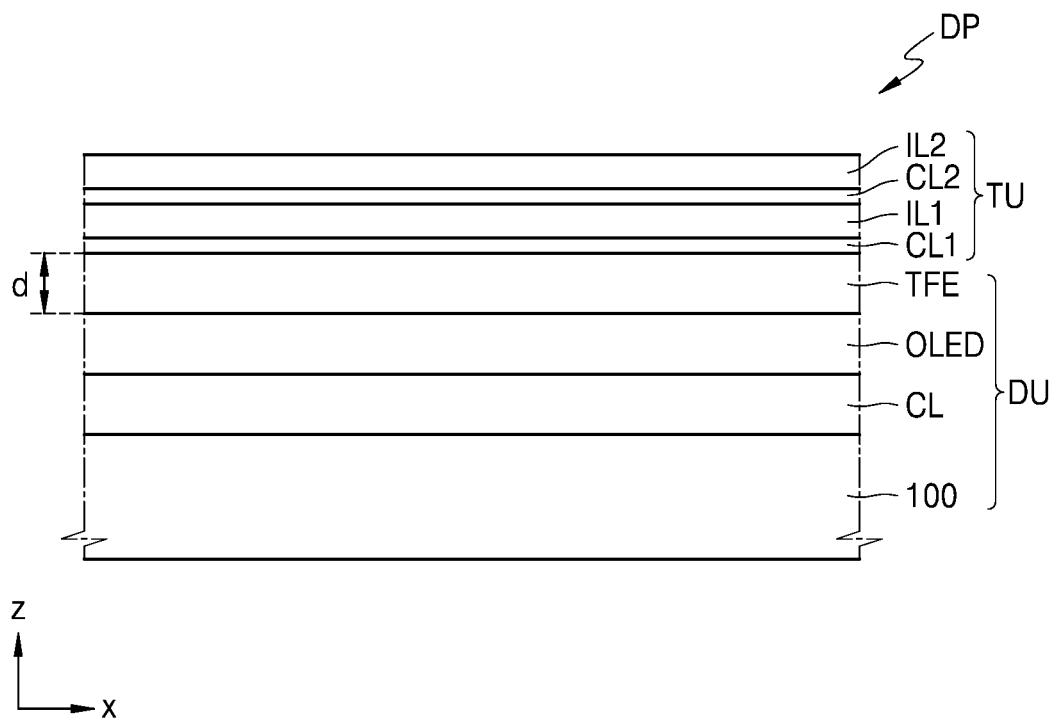
FIG. 5 is a cross-sectional view of a portion of a display apparatus according to an exemplary embodiment of the present inventive concepts.

FIG. 5 is a cross-sectional view of a portion of a display apparatus according to an exemplary embodiment of the present inventive concepts.

Referring to FIG. 5, a display panel DP includes a display unit DU and a touch unit TU. The display unit DU is simply illustrated to explain a stacking structure of the touch unit TU. For example, in an exemplary embodiment, the polarization unit PU of FIG. 2 and the window unit WU of FIG. 2 may also be arranged on the touch unit TU.

Figure 8:
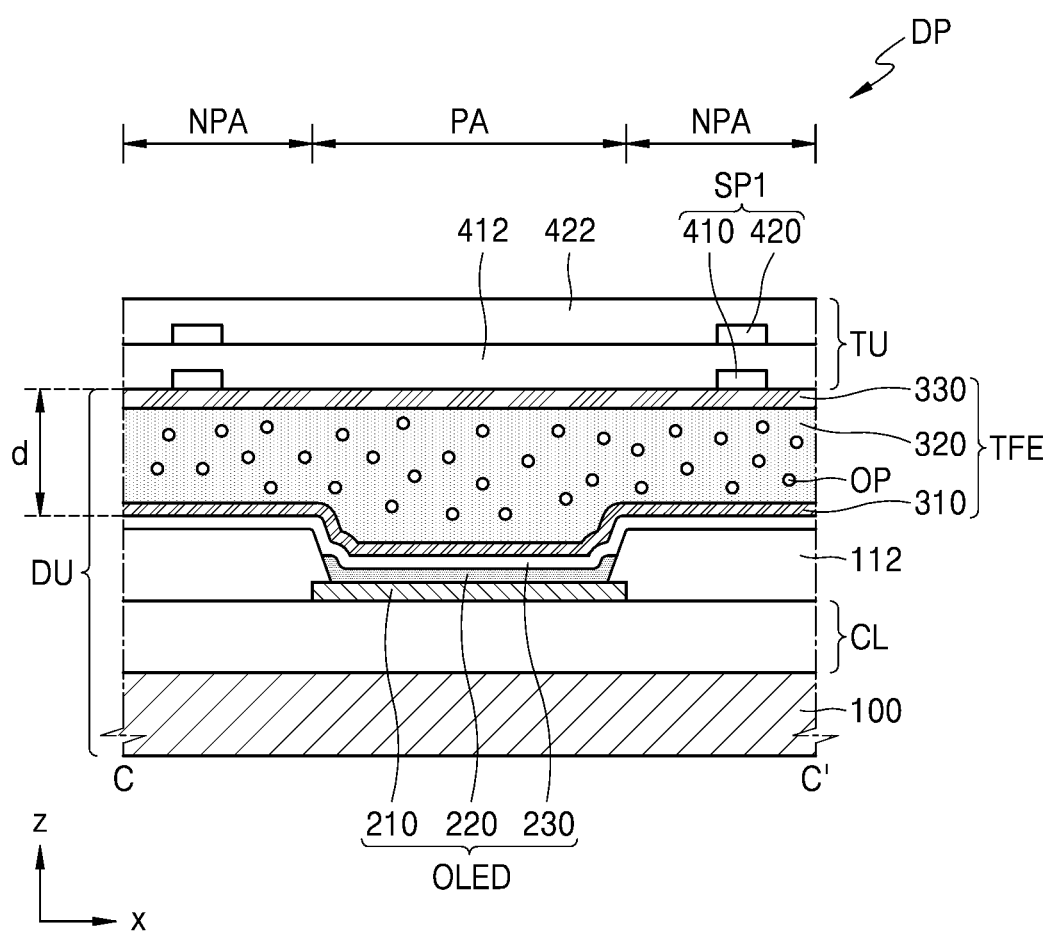
FIG. 8 is a cross-sectional view taken along line C-C' of FIG. 7 of a portion of a display apparatus according to an exemplary embodiment of the present inventive concepts.

The display unit DU may be obtained by sequentially arranging a circuit layer CL, an organic light-emitting diode OLED, and the thin-film encapsulation layer TFE on the substrate 100 (e.g., in the Z direction). The touch unit TU may be arranged directly on the thin-film encapsulation layer TFE. For example, as shown in the exemplary embodiment of FIG. 5, a bottom surface of the touch unit TU may be disposed directly on a top surface of the thin-film encapsulation layer TFE (e.g., in the Z direction). As shown in FIG. 8, the thin-film encapsulation layer TFE includes at least one encapsulation organic layer 320 which may provide a relatively flat base surface. Accordingly, even in embodiments in which the components of the touch unit TU to be described later are formed directly on the touch unit TU by consecutive processes, a defect rate may be reduced.

The touch unit TU may have a multi-layered structure. The touch unit TU includes a detection electrode, a signal line connected to the detection electrode, and at least one insulating layer. In an exemplary embodiment, the touch unit TU may detect an external input according to an electrostatic capacitive method. However, exemplary embodiments of the present inventive concepts are not limited thereto. For example, in another exemplary embodiment, the operation method of the touch unit TU may include sensing an external input according to an electromagnetic induction method, a pressure detection method, etc.

As shown in the exemplary embodiment of FIG. 5, the touch unit TU may include a first conductive layer CL1, a first insulating layer IL1, a second conductive layer CL2, and a second insulating layer IL2. Each of the first conductive layer CL1 and the second conductive layer CL2 may have a single-layered structure or a stacked multi-layered structure. A conductive layer having a single-layered structure may include a metal layer or a transparent conductive layer. In an exemplary embodiment, the metal layer may include molybdenum, silver, titanium, copper, aluminum, and an alloy thereof. In an exemplary embodiment, the transparent conductive layer may include a transparent conductive oxide such as indium tin oxide (ITO), indium zinc oxide (IZO), zinc oxide (ZnO), or indium tin zinc oxide (ITZO). Alternatively, the transparent conductive layer may include a conductive polymer (e.g., PEDOT), metal nano wires, graphene, or the like.

A conductive layer having a multi-layered structure may include a plurality of metal layers. In an exemplary embodiment, the plurality of metal layers may have a three-layered structure of Ti/Al/Ti. The conductive layer having a multi-layered structure may include at least one metal layer and at least one transparent conductive layer.

Each of the first conductive layer CL1 and the second conductive layer CL2 includes a plurality of patterns. It may be hereinafter understood that the first conductive layer CL1 includes first conductive patterns and the second conductive layer CL2 includes second conductive patterns. Each of the first and second conductive patterns may include detection electrodes and signal lines as shown in the exemplary embodiment of FIG. 6.

A stacking structure and a material of the detection electrodes may be determined by taking into account sensing sensitivity. An RC delay may affect sensing sensitivity. Since detection electrodes that include a metal layer have less resistance than those including a transparent conductive layer, an RC value is reduced. Accordingly, a charging time period of a capacitor defined between the detection electrodes is reduced. Detection electrodes including a transparent conductive layer are not visually recognizable by a user, compared with those including a metal layer, and an input area is increased, thereby increasing capacitance.

The detection electrodes including a metal layer may have a mesh shape, as will be described later with reference to FIG. 6 which prevents the detection electrodes from being visually recognized by a user.

Each of the first insulating layer IL1 and the second insulating layer IL2 may have a single-layered or multi-layered structure. Each of the first insulating layer IL1 and the second insulating layer IL2 may include an inorganic material, an organic material, or a combination thereof.

According to another exemplary embodiment, at least one of the first insulating layer IL1 and the second insulating layer IL2 may include an inorganic layer. In an exemplary embodiment, the inorganic layer may include at least one of aluminum oxide, titanium oxide, silicon oxide, silicon oxynitride, zirconium oxide, and hafnium oxide.

According to an exemplary embodiment, at least one of the first insulating layer IL1 and the second insulating layer IL2 may include an organic layer. For example, the organic layer may include at least one of acrylic resin, methacryl-based resin, polyisoprene, vinyl-based resin, epoxy-based resin, urethane-based resin, cellulose-based resin, siloxane-based resin, polyimide-based resin, polyamide-based resin, and perylene-based resin. However, exemplary embodiments of the present inventive concepts are not limited thereto.

According to an exemplary embodiment, a distance d between the touch unit TU and the organic light-emitting diode OLED (e.g., in the Z direction) may be about 5 µm to about 20 µm, and, for example, may be about 10 µm. The distance d is a thickness of the thin-film encapsulation layer TFE that is disposed between the touch unit TU and the organic light-emitting diode OLED. For example, as shown in the exemplary embodiment of FIG. 8, the distance d between the touch unit TU and the organic light-emitting diode OLED may be a distance d between the first conductive layer of the touch unit TU and an opposite electrode 230.

Figure 6:
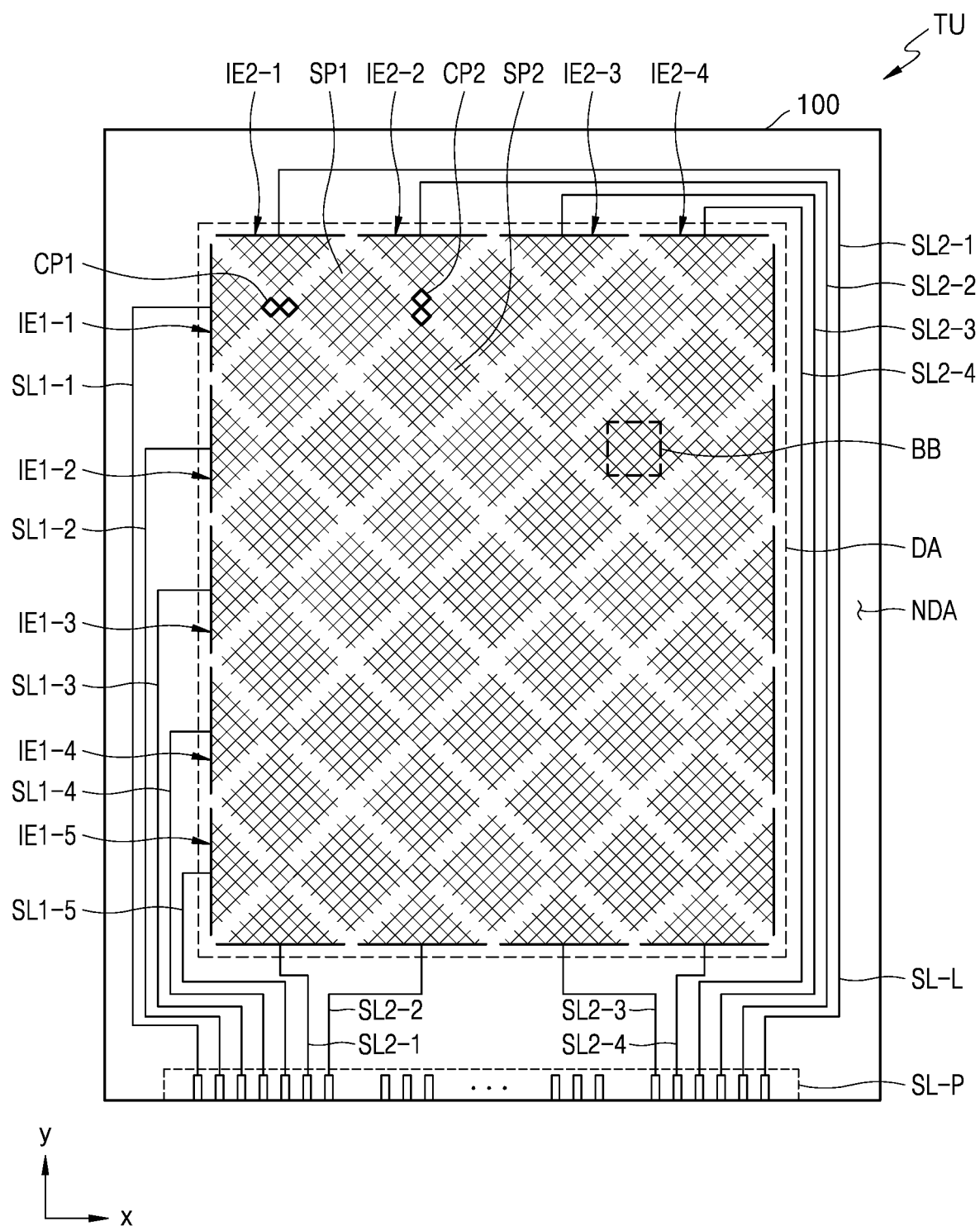
FIG. 6 is a top plan view of a touch unit of a display apparatus according to an exemplary embodiment of the present inventive concepts.
Figure 7:
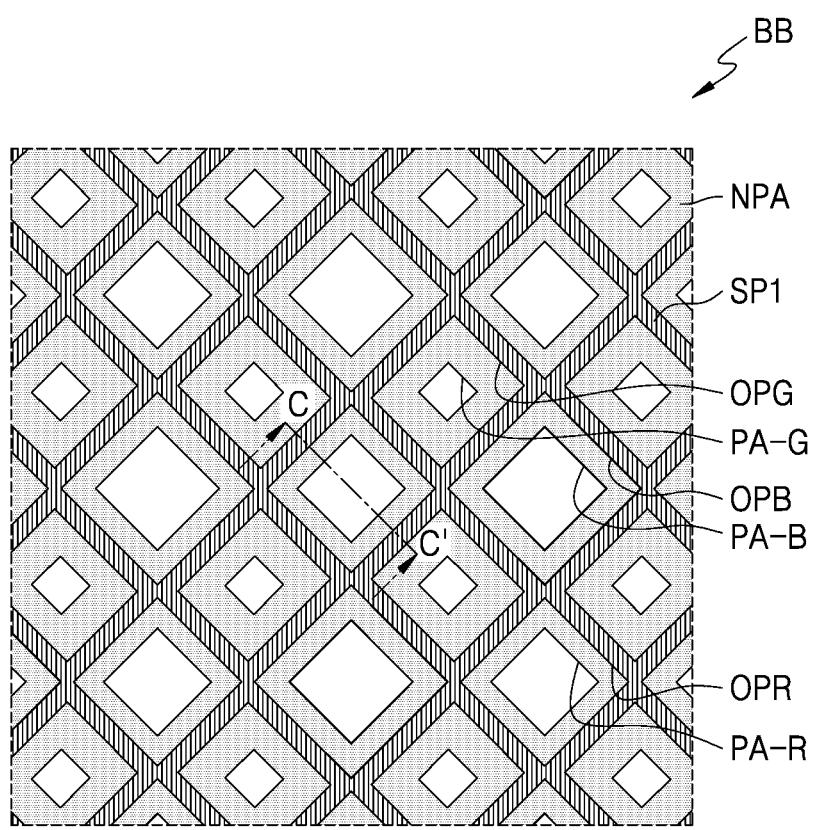
FIG. 7 is a magnified view of region BB of FIG. 6 according to an exemplary embodiment of the present inventive concepts.

FIG. 6 is a top plan view of a touch unit of a display apparatus according to an exemplary embodiment of the present inventive concepts, and FIG. 7 is a magnified view of a region BB of FIG. 6 according to an exemplary embodiment of the present inventive concepts.

Referring to FIG. 6, a touch unit TU may include first detection electrodes IE1-1 through 1E1-5, first signal lines SL1-1 through SL1-5 connected to the first detection electrodes IE1-1 through 1E1-5, respectively, second detection electrodes 1E2-1 through 1E2-4, and second signal lines SL2-1 through SL2-4 connected to the second detection electrodes 1E2-1 through 1E2-4, respectively.

In an exemplary embodiment, the touch unit TU forms the first detection electrodes 1E1-1 through 1E1-5 from the first conductive layer CL1 of FIG. 5 and forms the second detection electrodes 1E2-1 through 1E2-4 from the second conductive layer CL2 of FIG. 5. FIG. 6 illustrates the first detection electrodes IE1-1 through IE1-5 and the second detection electrodes 1E2-1 through IE2-4 each having a mesh shape. In an exemplary embodiment, the first detection electrodes IE1-1 through IE1-5 and the second detection electrodes 1E2-1 through IE2-4 may have a three-layered structure of titanium/aluminum/titanium. However, exemplary embodiments of the present inventive concepts are not limited thereto.

The touch unit TU may further include optical dummy electrodes arranged on boundary areas between the first detection electrodes IE1-1 through IE1-5 and the second detection electrodes 1E2-1 through IE2-4. For example, the touch unit TU may include first dummy electrodes formed from the first conductive layer CL1 and second dummy electrodes formed from the second conductive layer CL2.

The first dummy electrodes are connected to second sensor units SP2 of the second detection electrodes 1E2-1 through IE2-4 via contact holes. The second dummy electrodes are connected to first sensor units SP1 of the first detection electrodes IE1-1 through IE1-5 via contact holes. The first dummy electrodes and the second dummy electrodes may reduce resistance of the first detection electrodes IE1-1 through IE1-5 and the second detection electrodes 1E2-1 through 1E2-4.

The first detection electrodes IE1-1 through 1E1-5 include the first sensor units SP1, respectively, and first connection units CP1, respectively. The second detection electrodes 1E2-1 through IE2-4 include the second sensor units SP2, respectively, and second connection units CP2, respectively. Two first sensor units SP1 on both ends (e.g., a left edge and right edge of the first sensor units in the X direction) from among the first sensor units SP1 may have a smaller size than a first sensor unit SP1 in the center of the first detection electrodes (e.g., in the X direction). For example, the two first sensor units SP1 on both ends may be about half of the size of the other first sensor units SP1 of the first detection electrodes. Two second sensor units SP2 on both ends (e.g., a top edge and bottom edge of the second sensor units in the Y direction) from among the second sensor units SP2 may have a smaller size than a second sensor unit SP2 in the center of the second detection electrode (e.g., in the Y direction). For example, the two second sensor units SP2 on both ends may be about half of the size of the other second sensor units SP2 of the second electrode.

Although the exemplary embodiment of FIG. 6 illustrates the first detection electrodes 1E1-1 through 1E1-5 and the second detection electrodes 1E2-1 through 1E2-4 each having a pattern of a particular shape, such as a diamond shape, exemplary embodiments of the present inventive concepts are not limited thereto. For example, the first detection electrodes IE1-1 through 1E1-5 and second detection electrodes 1E2-1 through 1E2-4 may have a wide variety of shapes, such as any polygonal shape, and each of the first detection electrodes and second detection electrodes may have different shapes from each other. In an exemplary embodiment, each of the first detection electrodes IE1-1 through IE1-5 and the second detection electrodes 1E2-1 through 1E2-4 may have a shape (e.g., a bar shape) in which a sensor unit and a connection unit are not distinguished from each other.

The first sensor units SP1 within one first detection electrode are arranged in the X direction, and the second sensor units SP2 within one second detection electrode are arranged in the Y direction. However, exemplary embodiments of the present inventive concepts are not limited thereto. Each of the first connection units CP1 connects adjacent first sensor units SP1 to each other, and each of the second connection units CP2 connects adjacent second sensor units SP2 to each other.

The first signal lines SL1-1 through SL1-5 are connected to respective first ends of the first detection electrodes IE1-1 through 1E1-5, respectively. For example, as shown in the exemplary embodiment of FIG. 6, the first signal lines SL1-1 through SL1-5 may be connected to the respective first detection electrodes 1E1-1 through 1E1-5 positioned on a left edge (e.g., in the X direction) of the first sensor units SP1. However, exemplary embodiments of the present inventive concepts are not limited thereto. The second signal lines SL2-1 through SL2-4 are connected to respective both ends of the second detection electrodes 1E2-1 through IE2-4, respectively. For example, as shown in the exemplary embodiment of FIG. 6, the second signal lines SL2-1 through SL2-4 may be connected to respective second detection electrodes 1E2-1 through IE2-4 positioned on top and bottom edges (e.g., in the Y direction) of the second sensor units SP2. However, exemplary embodiments of the present inventive concepts are not limited thereto. According to another exemplary embodiment, the first signal lines SL1-1 through SL1-5 may be connected to respective both ends (e.g., left and right edges in the X direction) of the first detection electrodes 1E1-1 through 1E1-5, respectively. According to another exemplary embodiment, the second signal lines SL2-1 through SL2-4 may be connected to respective first ends of the second detection electrodes 1E2-1 through IE2-4, respectively.

The touch unit TU including the second signal lines SL2-1 through SL2-4 connected to respective both ends of the second detection electrodes 1E2-1 through IE1-4, respectively, may provide improved sensing sensitivity, compared with a touch unit TU according to a comparative example including the second signal lines SL2-1 through SL2-4 connected only to respective first ends of the second detection electrodes 1E2-1 through IE2-4, respectively. Since the second detection electrodes 1E2-1 through IE2-4 have a length (e.g., extending in the Y direction) that is larger than a length (e.g., extending in the X direction) of the first detection electrodes 1E1-1 through IE1-5, a voltage drop of a detection signal (or a transmission signal) occurs, and accordingly, sensing sensitivity may be reduced. According to the present exemplary embodiment, since a detection signal (or a transmission signal) is provided via the second signal lines SL2-1 through SL2-4 connected to respective both ends of the second detection electrodes 1E2-1 through IE2-4, respectively, the occurrence of a voltage drop of the detection signal (or the transmission signal) are prevented, and accordingly, reduction of sensing sensitivity may be prevented.

Each of the first signal lines SL1-1 through SL1-5 and the second signal lines SL2-1 through SL2-4 may include a line unit SL-L and a pad unit SL-P.

Referring to the exemplary embodiments shown in FIGS. 6 and 7, each of the first detection electrodes IE1-1 through IE1-5 and the second detection electrodes 1E2-1 through IE2-4 may have a mesh shape. Since each of the first detection electrodes 1E1-1 through 1E1-5 and the second detection electrodes 1E2-1 through IE2-4 has a mesh shape, parasitic capacitance between the first and second detection electrodes IE1-1 through 1E1-5 and 1E2-1 through 1E2-4 and electrodes (for example, an opposite electrode) of the display unit DU of FIG. 5 may be reduced. As will be described later, the first detection electrodes IE1-1 through IE1-5 and the second detection electrodes 1E2-1 through IE2-4 do not overlap light-emission areas PA-R, PA-G, and PA-B, and thus are not visible to a user of the display apparatus 1.

In an exemplary embodiment, the first detection electrodes 1E1-1 through 1E1-5 and the second detection electrodes 1E2-1 through 1E2-4 each having a mesh shape may include silver, aluminum, copper, chromium, nickel, titanium, and the like on which a low-temperature process may be executed. Accordingly, even when an input sensing unit (ISU) is formed via a consecutive process, damage to an organic light-emitting diode OLED of FIG. 8 may be prevented. However, exemplary embodiments of the present inventive concepts are not limited thereto.

While FIG. 7 illustrates only a first sensor unit SP1, each of the other first sensor units and each of the second sensor units SP2 may have substantially the same structure as the first sensor unit SP1 illustrated in FIG. 7. The first sensor unit SP1 does not overlap the light-emission areas PA-R, PA-G, and PA-B and overlaps the non-light-emission area NPA. Each of the light-emission areas PA-R, PA-G, and PA-B may be defined the same as a light-emission area PA of FIG. 8.

Mesh lines of the first sensor unit SP1 may define a plurality of mesh holes OPR, OPG, and OPB (hereinafter, referred to mesh holes). In an exemplary embodiment, the mesh lines may have a three-layered structure of titanium/aluminum/titanium. The mesh holes OPR, OPG, and OPB may have one-to-one correspondence with the light-emission areas PA-R, PA-G, and PA-B.

The light-emission areas PA-R, PA-G, and PA-B may be classified into a plurality of groups according to the colors of light beams generated by organic light-emitting diodes OLEDs. FIG. 7 illustrates the light-emission areas PA-R, PA-G, and PA-B that are classified into three groups according to the colors of emitted light beams. According to an exemplary embodiment, the light-emission areas PA-R, PA-G, and PA-B may emit red light, green light, and blue light, respectively.

In the exemplary embodiment shown in FIG. 7, the mesh holes OPR, OPG, and OPB are illustrated as having one-to-one correspondence with the light-emission areas PA-R, PA-G, and PA-B. However, exemplary embodiments of the present inventive concepts are not limited thereto. For example, in other exemplary embodiments, each of the mesh holes OPR, OPG, and OPB may correspond to two or more of the light-emission areas PA-R, PA-G, and PA-B. In the exemplary embodiment of FIG. 7, planar shapes of the mesh holes OPR, OPG, and OPB correspond to the shapes of the light-emission areas PA-R, PA-G, and PA-B and are thus illustrated as diamond shapes. However, exemplary embodiments of the present inventive concepts are not limited thereto. For example, the mesh holes OPR, OPG, and OPB may have planar shapes having any other polygonal shape other than a diamond shape, such as polygonal shapes having round corners, etc.

According to the present exemplary embodiment, the thickness of the thin-film encapsulation layer TFE described above with reference to FIG. 5 may be adjusted such that noise generated by the components of the organic light-emitting diode OLED does not affect the touch unit TU. For example, in an exemplary embodiment, the thickness of the thin-film encapsulation layer TFE may be about 10 μm. In another exemplary embodiment, the thickness of the thin-film encapsulation layer may be about 5 μm to about 15 μm.

In a comparative example, when a touch unit is included as a special panel (e.g., a touch panel) and is laminated on a display unit (e.g., a display panel), a thickness of a substrate included in the touch panel causes a gap of about 200 μm or greater between a detection electrode included in the touch panel and an opposite electrode included in the display panel.

However, in an embodiment in which the touch unit TU is arranged directly on the display unit DU as in an exemplary embodiment of the present inventive concepts, only the thickness of the thin-film encapsulation layer TFE, such as a gap of about 10 μm, is between the detection electrode (e.g., the first conductive layer CL1 and the second conductive layer CL2) of the touch unit TU and the opposite electrode 230 of FIG. 8 included in the display unit DU. Therefore, a parasitic capacitance between the detection electrode of the touch unit TU and the opposite electrode included in the display unit DU increases by about 20 times or greater, and accordingly, sensitivity of the touch unit TU is reduced.

Capacitance may satisfy the formula of Equation 1:

$$cap = \frac{\varepsilon A}{d} \quad \text{[Equation 1]}$$

In Equation 1, cap is capacitance, E is permittivity, A is area and d is distance between the detection electrode of the touch unit TU and the opposite electrode. Therefore, capacitance cap is defined as being inversely proportional to a distance d between the detection electrode of the touch unit TU and the opposite electrode and proportional to permittivity c and an area A. Accordingly, reduction of the permittivity E is needed to reduce the parasitic capacitance between the detection electrode and the opposite electrode.

The refractive index may satisfy the formula of Equation 2:

$$n = \frac{c}{v} = \frac{\sqrt{\mu\varepsilon}}{\sqrt{\mu_0\varepsilon_0}} \cong \sqrt{\varepsilon_r}$$

refractive index, ε: permittivity, μ: permeability, v: speed of light in a medium, c: speed of light in a vacuum.

Referring to Equation 2, the permittivity E is defined as being substantially proportional to a square of the refractive index n.

Accordingly, the display apparatus 1 according to an exemplary embodiment of the present inventive concepts includes a thin-film encapsulation layer TFE having a low refractive index to reduce the permittivity c of the thin-film encapsulation layer TFE. In an exemplary embodiment, the thin-film encapsulation layer TFE may include organic particles each having a core-shell structure which provides a low refractive index. This will be described in detail with reference to FIGS. 8 and 9.

Figure 9:
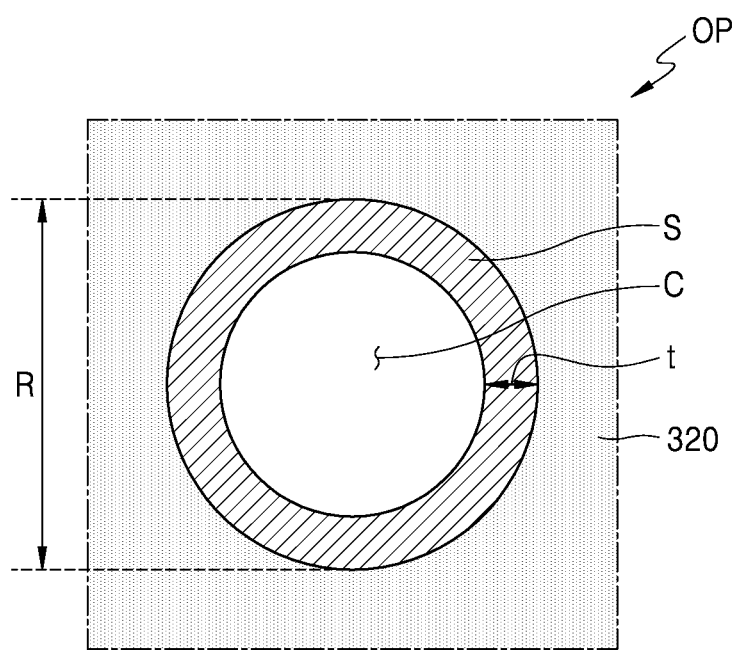
FIG. 9 is a magnified view of an organic particle of FIG. 8 according to an exemplary embodiment of the present inventive concepts.

FIG. 8 is a cross-sectional view taken along line C-C' of FIG. 7 of a portion of a display apparatus according to an exemplary embodiment. FIG. 9 is a magnified view of an organic particle OP of FIG. 8.

Referring to FIG. 8, the display unit DU is arranged on the substrate 100. The display unit DU may be obtained by sequentially arranging the circuit layer CL, the organic light-emitting diode OLED, and the thin-film encapsulation layer TFE on the substrate 100. A bottom portion of the circuit layer CL may be disposed directly on a top portion of the substrate 100 (e.g., in the Z direction). A bottom portion of the light-emitting diode OLED may be disposed directly on a top portion of the circuit layer CL (e.g., in the Z direction). A bottom portion of the thin-film encapsulation layer TFE may be disposed directly on a top portion of an organic light-emitting diode OLED (e.g., in the Z direction). A bottom portion of the touch unit TU may be disposed directly on a top portion of the thin-film encapsulation layer TFE (e.g., in the Z direction).

The organic light-emitting diode OLED includes a pixel electrode 210, the opposite electrode 230 arranged on the pixel electrode 210 to face the pixel electrode 210, and an intermediate layer 220 including an emission layer between the pixel electrode 210 and the opposite electrode 230. A bottom portion of the intermediate layer 220 is arranged (e.g., in the Z direction) on a top portion of the pixel electrode 210 exposed by a pixel defining layer 112, and may be defined as the light-emission area PA. The periphery of the light-emission area PA, namely, an area between light-emission areas PA (e.g., in the X direction), may be defined as a non-light-emission area NPA.

The organic light-emitting diode OLED is covered with the thin-film encapsulation layer TFE. The thin-film encapsulation layer TFE may include at least one inorganic encapsulation layer and at least one organic encapsulation layer. For example, the exemplary embodiment shown in FIG. 8 illustrates that the thin-film encapsulation layer TFE includes a first inorganic encapsulation layer 310, a second inorganic encapsulation layer 330, and an organic encapsulation layer 320 disposed therebetween. For example, a bottom portion of the first organic encapsulation layer 320 is disposed directly on a top portion of the first inorganic encapsulation layer 310 (e.g., in the Z direction) and a bottom portion of the second inorganic encapsulation layer 330 is disposed directly on a top portion of a first organic encapsulation layer 320 (e.g., in the Z direction). However, in another exemplary embodiment, the number of organic encapsulation layers, the number of inorganic encapsulation layers, and a stacking sequence thereof may be modified.

In an exemplary embodiment, the first and second inorganic encapsulation layers 310 and 330 may include at least one inorganic material, such as aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may be a single layer or multi-layer including the aforementioned materials. The first inorganic encapsulation layer 310 and the second inorganic encapsulation layer 330 may include the same material or may include different materials.

Thicknesses (e.g., lengths in the Z direction) of the first inorganic encapsulation layer 310 and the second inorganic encapsulation layer 330 may be different from each other. For example, in an exemplary embodiment, the thickness of the first inorganic encapsulation layer 310 may be greater than the thickness of the second inorganic encapsulation layer 330. However, in other exemplary embodiments, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

In an exemplary embodiment of the present inventive concepts, the organic encapsulation layer 320 may include a monomer-based material or a polymer-based material. Examples of the polymer-based material may include acrylic resin, epoxy-based resin, polyimide, and polyethylene. In an exemplary embodiment, the organic encapsulation layer 320 may include acrylate.

The organic encapsulation layer 320 may also include organic particles OP each having a core-shell structure including a hollow core and a shell surrounding the hollow core. The organic particles OP float within the organic encapsulation layer 320 and may be distributed in a random, non-uniform arrangement. According to an exemplary embodiment, the organic particles OP may be included within the organic encapsulation layer 320 in a concentration of about 10% through 80% of the volume of the organic encapsulation layer. In embodiments in which the percentage of the organic particles OP is less than 10%, the reduction of the permittivity ε may be insufficient. On the other hand, in embodiments in which the percentage of the organic particles OP exceeds 80%, the organic particles OP agglomerate together, and accordingly, may not easily disperse.

The organic encapsulation layer 320 including the organic particles OP may have permittivity of about 2.6 or less. According to an exemplary embodiment, the organic encapsulation layer 320 may have permittivity of about 1.0 to 2.6. The organic encapsulation layer 320 including the organic particles OP may have a refractive index of about 1.4 or less. According to an exemplary embodiment, the organic encapsulation layer 320 may have a refractive index of about 1.0 to 1.4. The organic encapsulation layer 320 which includes the organic particles OP may have optical characteristics that provide both low permittivity and a low refractive index.

In a comparative example, when an organic encapsulation layer includes inorganic particles, for example, silica particles, a low refractive index of 1.4 or less may be attained. However, a low permittivity of 2.6 or less may not be attained. In this embodiment, a dielectric constant increases due to charged particles (for example, $OH^-$) existing on an inorganic particle surface. The permittivity increases as reactivity to an external electrical field increases due to the charged particles existing on the inorganic particle surface. In this embodiment, the organic encapsulation layer does not follow Equation 2 described above. Therefore, even in embodiments which include hollow particles, a low refractive index does not lead to low permittivity based on the material used to form the hollow particles.

Therefore, the organic encapsulation layer 320 according to an exemplary embodiment includes organic particles OP including no charged particles on a surface of the organic encapsulation layer 320. Since the organic encapsulation layer 320 does not include any charged particles on its surface, the low refractive index of about 1.4 or less may be attained, and the low permittivity of about 2.6 or less may also be attained.

The touch unit TU may be disposed directly on the thin film encapsulation TFE. As described more specifically with respect to FIG. 5, the touch unit TU may include a first conductive layer 410 having first sensors SP1, a second conductive layer 420 having second sensors SP2, a first insulating layer 412 and a second insulating layer 422.

Referring to FIG. 9, the organic particle OP may have a core-shell structure. The organic particle OP may include a hollow core C and a shell S surrounding the hollow core C. In this case, the hollow core C may be understood as an empty space that includes no materials and is disposed within the shell S. According to an exemplary embodiment, the organic particle OP may have a diameter of about 10 nm to about 200 nm. Preferably, the organic particle OP may have a diameter of about 60 nm to about 100 nm. In embodiments in which the diameter of the organic particle OP is less than 10 nm, the permittivity E is slightly reduced, and, in embodiments in which the diameter of the organic particle OP exceeds 200 nm, the permittivity ε is greatly reduced. Therefore, light is excessively scattered, and a haze is generated and transmittance of the thin-film encapsulation layer TFE is reduced. While the exemplary embodiment of FIG. 9 shows the shell S having a circular shape, in other embodiments the shell may have a variety of different shapes.

According to an exemplary embodiment, the shell S may include a high molecular weight material. For example, in an exemplary embodiment, the shell S may include at least one selected from an acrylic polymer, polyimide, an urethane polymer, a styrene-based polymer, a siloxane-based polymer, an epoxy-based polymer, and a combination thereof. However, exemplary embodiments of the present inventive concepts are not limited thereto, and the shell S may include polymers based on a variety of materials other than the aforementioned materials.

According to an exemplary embodiment, the shell S may have a thickness of about 5 nm to about 50 nm. For example, the shell S may have a thickness t of about 8 nm to about 20 nm. In another exemplary embodiment, the shell S may have a thickness of about 15 nm to about 35 nm. In organic particles OP having the same diameter, as the thickness of the shell S decreases, the percentage of the hollow core C increases, which results in an increase in the reduction of the permittivity ε. However, when the thickness of the shell S is less than 5 nm, the organic particles OP are very likely to break. In embodiments in which the thickness of the shell S exceeds 50 nm, the percentage of the hollow core C decreases, and the permittivity ε is slightly reduced.

According to an exemplary embodiment, the surface of the shell S may be electrically neutral. For example, the surface of the shell S may be electrically neutral by not including charged particles having positive or negative charges thereto. The charged particles may be ion particles for example, ions, protons, and electrons.

Figure 10:
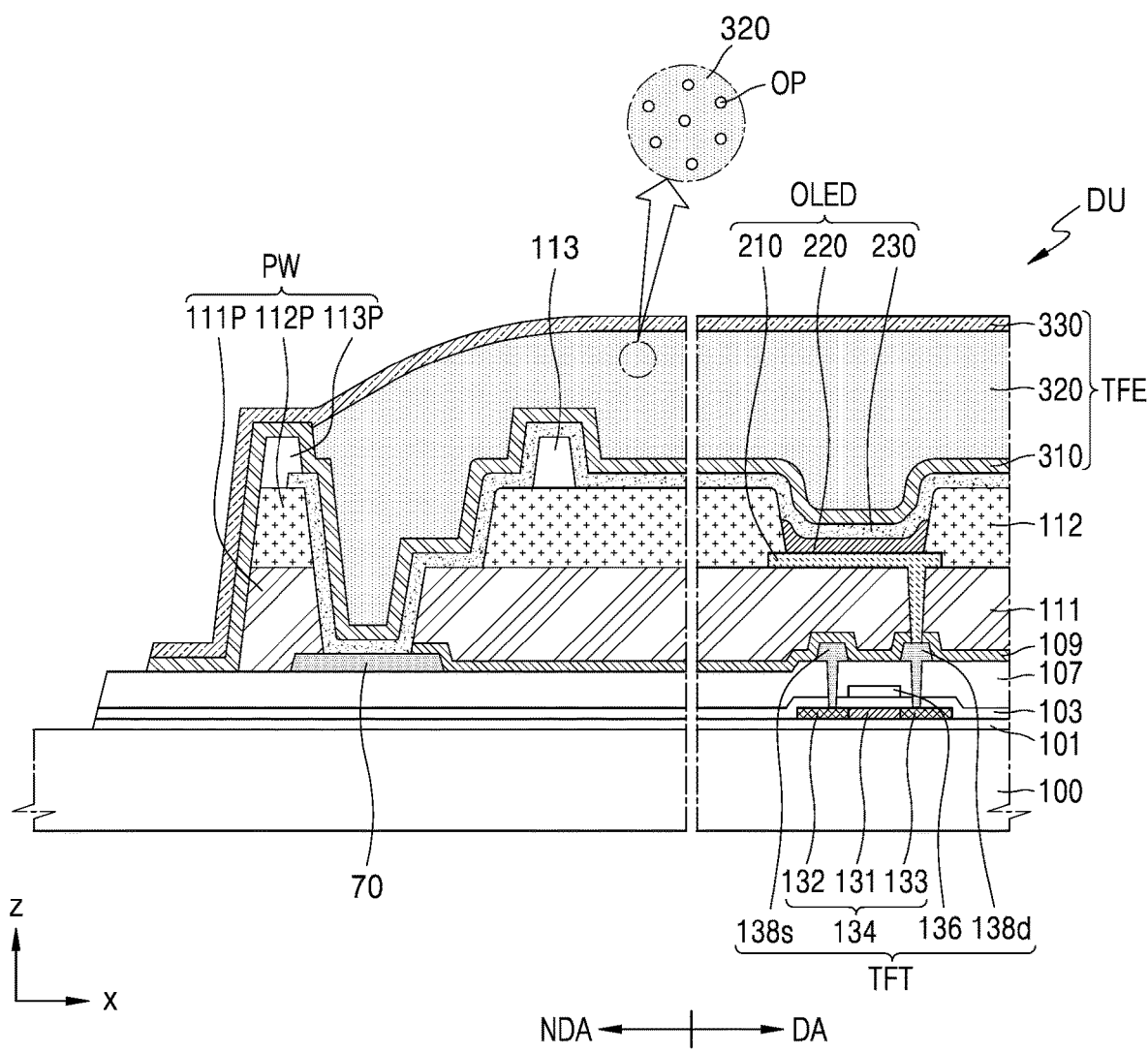
FIG. 10 is a cross-sectional view of a portion of a display apparatus according to an exemplary embodiment of the present inventive concepts.

FIG. 10 is a cross-sectional view of a portion of a display apparatus according to an exemplary embodiment of the present inventive concepts. FIG. 10 illustrates a cross-section of the display unit DU and also illustrates the display area DA and the non-display area NDA. The touch unit TU that is arranged on the display unit DU is not illustrated.

Referring to FIG. 10, in an exemplary embodiment, the substrate 100 may include glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 including polymer resin may be flexible, rollable, or bendable. The substrate 100 may have a multi-layered structure which includes a layer having the polymer resin and an inorganic layer.

A buffer layer 101 may be disposed on the substrate 100 and may reduce or prevent infiltration of a foreign material, moisture, or ambient air from below the substrate 100 and may provide a flat surface on the substrate 100. For example, as shown in the exemplary embodiment of FIG. 10, a bottom portion of the buffer layer 101 may be disposed directly on a top portion of the substrate 100 (e.g., in the Z direction). The buffer layer 101 may include an inorganic material (such as an oxide or nitride), an organic material, or an organic and inorganic compound, and may be formed as a single layer or multiple layers of an inorganic material and an organic material. According to an exemplary embodiment, the buffer layer 101 may include silicon oxide ($SiO_x$), silicon nitride ($SiN_x$), or/and silicon oxynitride (SiON). However, exemplary embodiments of the present inventive concepts are not limited thereto.

A thin-film transistor TFT and a storage capacitor may be disposed on the substrate 100 at a position corresponding to the display area DA. An organic light-emitting diode OLED is electrically connected to the thin-film transistor TFT and the storage capacitor.

The thin-film transistor TFT may be located on the display area DA of the substrate 100. The thin film transistor TFT may include a semiconductor layer 134, a gate electrode 136, a source electrode 138s, and a drain electrode 138d. Although the exemplary embodiment of FIG. 10 shows the thin-film transistor TFT located on the display area DA, the thin-film transistor TFT may also be located on the non-display area NDA. For example, the thin-film transistor TFT located on the non-display region NDA may control a driving circuit.

In an exemplary embodiment, the semiconductor layer 134 may include at least one of amorphous silicon (a-Si), polysilicon, an oxide semiconductor, and an organic semiconductor material. According to an exemplary embodiment, the semiconductor layer 134 may include low temperature poly-silicon (LTPS). Since a polysilicon material has a high electron mobility (100 $cm^2/Vs$ or greater), energy consumption power is low and reliability is high, and thus may be used as a semiconductor layer of a thin-film transistor of a display apparatus.

The semiconductor layer 134 may include a channel region 131 that is overlapped by the gate electrode 136 (e.g., in the Z direction), and a source region 132 and a drain region 133 are disposed on both sides (e.g., in the X direction) of the channel region 131, respectively, and include a higher concentration of impurities than the channel region 131. The impurities may be N-type impurities or P-type impurities. The source region 132 and the drain region 133 may be a source electrode and a drain electrode of the thin-film transistor TFT.

A gate insulating layer 103 may be between the semiconductor layer 134 and the gate electrode 136 (e.g., in the Z direction). In an exemplary embodiment, the gate insulating layer 103 may include silicon oxide ($SiO_x$), silicon nitride ($SiN_x$), or/and silicon oxynitride (SiON), and may be a single layer or multiple layers.

An interlayer insulating layer 107 may be disposed on the gate electrode 136 (e.g., in the Z direction). In an exemplary embodiment, the interlayer insulating layer 107 may include silicon oxide ($SiO_x$), silicon nitride ($SiN_x$), or/and silicon oxynitride (SiON), and may be a single layer or multiple layers.

The thin film transistor TFT may include the source electrode 138s and the drain electrode 138d respectively connected to the source region 132 and the drain region 133 of the semiconductor layer 134. The source electrode 138s and the drain electrode 138d may be electrically connected to the source region 132 and the drain region 133 of the semiconductor layer 134, respectively, via a contact hole that penetrates through the gate insulating layer 103 and the interlayer insulating layer 107.

The source electrode 138s and the drain electrode 138d may include aluminum (Al), copper (Cu), or titanium (Ti), and may be formed as a single layer or as a multi-layer. According to an exemplary embodiment, the source electrode 138s and the drain electrode 138d may have a multi-layer structure, such as Ti/Al/Ti or TiN/Al/Ti.

In an exemplary embodiment, the data line DL of FIG. 4 and the driving voltage line PL of FIG. 4 may be formed on the same layer as a layer on which the source electrode 138s and the drain electrode 138d are formed, and may include the same material as the material included in the source electrode 138s and the drain electrode 138d.

According to an exemplary embodiment, the thin-film transistor TFT may be covered by a protection layer 109. The protection layer 109 may prevent exposure of a wire including metal that may be damaged by an etchant to an etching environment, such as aluminum, during the manufacture of the display apparatus. In an exemplary embodiment, the protection layer 109 may extend (e.g., in the X direction) to the non-display area NDA. In some embodiments, the protection layer 109 may be omitted.

A planarization layer 111 that planarizes an upper surface of the thin-film transistor TFT may be arranged on the protection layer 109. For example, as shown in the exemplary embodiment of FIG. 10, a bottom surface of the planarization layer 111 may be disposed directly on a top surface of the protection layer 109 (e.g., in the Z direction). An upper surface on which the pixel electrode 210 is to be arranged may be planarized by the planarization layer 111. In an exemplary embodiment, the planarization layer 111 may include an organic insulative material and may be formed as a single layer or as multiple layers.

The pixel electrode 210 may be on the planarization layer 111. The pixel electrode 210 may be a (semi) light-transmissive electrode or a reflective electrode. According to an exemplary embodiment, the pixel electrode 210 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to an exemplary embodiment, the pixel electrode 210 may have a stack structure of ITO/Ag/ITO. However, exemplary embodiments of the present inventive concepts are not limited thereto.

The pixel defining layer 112 may be on the pixel electrode 210, and the pixel defining layer 112 may have an opening corresponding to each sub-pixel. The pixel defining layer 112 may define a pixel region having a light-emission region, by including an opening via which at least a center portion of the pixel electrode 210 is exposed. The pixel defining layer 112 may prevent an arc or the like from occurring between an edge of the pixel electrode 210 and the opposite electrode 230 by increasing a distance between the edge of the pixel electrode 210 and the opposite electrode 230. In an exemplary embodiment, the pixel defining layer 112 may be formed of an organic material, such as polyimide or hexamethyldisiloxane (HMDSO).

In an exemplary embodiment, a spacer 113 may be on the pixel defining layer 112. For example, a bottom surface of the spacer 113 may be disposed directly on a top surface of the pixel defining layer (e.g., in the Z direction). In the exemplary embodiment shown in FIG. 10, the spacer 113 is located on the non-display area NDA. However, in other exemplary embodiments, the spacer 113 may be located on the display area DA. The spacer 113 may prevent the organic light-emitting diode OLED from being damaged due to the sagging of a mask in a masking process. In an exemplary embodiment, the spacer 113 may include an organic insulative material and may be formed as a single layer or as multiple layers.

The planarization layer 111, the pixel defining layer 112, and the spacer 113 may include an organic insulating material. In an exemplary embodiment, the organic insulating material may include an imide-based polymer, a commercial polymer such as polymethyl methacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, a blend thereof, etc. According to an exemplary embodiment, the planarization layer 111 may include polyimide. However, exemplary embodiments of the present inventive concepts are not limited thereto.

The intermediate layer 220 is disposed between the pixel electrode 210 and the opposite electrode 230 (e.g., in the Z direction). For example, as shown in the exemplary embodiment of FIG. 10, a bottom surface of the intermediate layer 220 is disposed on a top surface of the pixel electrode 210 (e.g., in the Z direction). A bottom surface of the opposite electrode 230 is disposed on a top surface of the intermediate layer 220 (e.g., in the Z direction). The intermediate layer 220 may include a low-molecular weight or high-molecular weight material.

In exemplary embodiments in which the intermediate layer 220 includes a low molecular weight material, the intermediate layer 220 may be formed by stacking a hole injection layer (HIL), a hole transport layer (HTL), an emission layer (EML), an electron transport layer (ETL), and an electron injection layer (EIL) in a single structure or a composite structure, and may include any of various materials such as copper phthalocyanine (CuPc), N,N'-Di(naphthalene-1-yl)-N,N'-diphenyl-benzidine (NPB), or tris-8-hydroxyquinoline aluminum (Alq3). However, exemplary embodiments of the present inventive concepts are not limited thereto. In an exemplary embodiment, the layers may be formed via vacuum deposition.

In exemplary embodiments in which the intermediate layer 220 includes a high-molecular weight material, the intermediate layer 220 may generally have a structure including an HTL and an EML. In this embodiment, the HTL may include poly(ethylenedioxythiophene) (PEDOT), and the EML may include a high-molecular weight material such as a polyphenylene vinylene (PPV)-based material or a polyfluorene-based material.

However, the intermediate layer 220 is not limited to the above-described structure, and may have any of various other structures. For example, at least one of the layers that constitute the intermediate layer 220 may be integrally formed with the opposite electrode 230. According to another exemplary embodiment, the intermediate layer 220 may include a layer patterned to correspond to each of a plurality of pixel electrodes 210.

In an exemplary embodiment, the opposite electrode 230 may be arranged on the display area DA and may cover the entire display area DA. For example, the opposite electrode 230 may be integrally formed to cover a plurality of pixels. However, in other exemplary embodiments, the opposite electrode 230 may comprise discrete patterns which only extend within a single pixel. The opposite electrode 230 may electrically contact a common power supply line 70 arranged on the non-display area NDA. As shown in the exemplary embodiment of FIG. 10, the opposite electrode 230 may extend (e.g., in the X direction) to a partition wall PW.

The thin-film encapsulation layer TFE may cover the entirety of the display area DA, and extend (e.g., in the X direction) toward the non-display area NDA to cover a portion of the non-display area NDA. As shown in the exemplary embodiment of FIG. 10, the thin-film encapsulation layer TFE may extend (e.g., in the X direction) to outside of the common power supply line 70. For example, the end of the thin-film encapsulation layer TFE in the non-display area NDA may extend farther away from the display area DA (e.g., in the X direction) than a lateral edge of the common power supply line 70 that is farthest from the display area DA.

As shown in the exemplary embodiment of FIG. 10, the thin-film encapsulation layer TFE may include the first inorganic encapsulation layer 310, the second inorganic encapsulation layer 330, and the organic encapsulation layer 320 therebetween. The organic encapsulation layer 320 may include the organic particles OP, as described above with reference to FIGS. 8 and 9. The organic particles OP may lower the refractive index n and the permittivity ε of the organic encapsulation layer 320. Accordingly, the parasitic capacitance between the touch unit TU on the thin-film encapsulation layer TFE and the opposite electrode 230 is lowered, and thus sensitivity of the touch unit TU may be improved.

The partition wall PW may be located on the non-display area NDA of the substrate 100. According to an exemplary embodiment, the partition wall PW may include, but is not limited to, a portion 111p of the planarization layer 111, a portion 112P of the pixel defining layer 112, and a portion 113P of the spacer 113.

The partition wall PW is arranged to surround the display area DA, and may prevent the organic encapsulation layer 320 of the thin-film encapsulation layer TFE from overflowing to the outside of the substrate 100. Accordingly, the organic encapsulation layer 320 may contact an inner surface of the partition wall PW that faces the display area DA. In this embodiment, the organic encapsulation layer 320 contacting the inner surface of the partition wall PW may be understood as the first inorganic encapsulation layer 310 being between the organic encapsulation layer 320 and the partition wall PW and the organic encapsulation layer 320 being in direct contact with the first inorganic encapsulation layer 310. The first inorganic encapsulation layer 310 and the second inorganic encapsulation layer 330 may be on the partition wall PW and may extend toward an edge of the substrate 100.

According to exemplary embodiments of the present inventive concepts as described above, a display apparatus having a reduced thickness and at the same time having an improved touch sensitivity may be realized. Of course, the scope of the disclosure is not limited thereto.

It should be understood that exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate comprising a display area and a non-display area;
   a light-emitting device on the display area;
   a thin-film encapsulation layer on the light-emitting device, the thin-film encapsulation layer comprising at least one inorganic encapsulation layer and at least one organic encapsulation layer, wherein the organic encapsulation layer includes a plurality of organic particles having a core-shell structure that includes a hollow core and a shell surrounding the hollow core; and
   a touch unit on the thin-film encapsulation layer.

2. The display apparatus of claim 1, wherein the organic encapsulation layer has permittivity of about 2.6 or less.

3. The display apparatus of claim 1, herein the organic encapsulation layer has a refractive index of about 1.4 or less.

4. The display apparatus of claim 1, wherein the shell comprises a high molecular weight material.

5. The display apparatus of claim 4, wherein the shell comprises at least one compound selected from an acrylic polymer, polyimide, an urethane polymer, a styrene-based polymer and a siloxane-based polymer, an epoxy-based polymer.

6. The display apparatus of claim 1, wherein a surface of the shell is electrically neutral.

7. The display apparatus of claim 6, wherein the surface of the shell does not include any charged particles thereon.

8. The display apparatus of claim 1, wherein a thickness of the shell is about 5 nm to about 50 nm.

9. The display apparatus of claim 1, wherein a diameter of each of the plurality of organic particles is about 10 nm to about 200 nm.

10. The display apparatus of claim 1, wherein:
    the organic encapsulation layer includes an organic encapsulation material comprising a monomer-based organic material, and
    the organic particles are included in the organic encapsulation layer at a percentage of about 10% to about 80% of a volume of the organic encapsulation material.

11. The display apparatus of claim 1, wherein:
    the touch unit is directly on the thin-film encapsulation layer, wherein the touch unit comprises:
    a detection electrode on the display area; and
    a signal line on the non-display area and connected to the detection electrode.

12. The display apparatus of claim 11, wherein the detection electrode has a mesh shape.

13. The display apparatus of claim 11, wherein:
    the detection electrode comprises a first detection electrode and a second detection electrode; and
    the signal line comprises a first signal line connected to the first detection electrode and a second signal line connected to the second detection electrode.

14. The display apparatus of claim 11, wherein the detection electrode comprises:
    a first conductive layer;
    a second conductive layer on the first conductive layer;
    a first insulating layer between the first conductive layer and the second conductive layer; and
    a second insulating layer on the second conductive layer.

15. The display apparatus of claim 14, wherein the first conductive layer and the second conductive layer are electrically connected to each other via a contact hole defined in the first insulating layer.

16. The display apparatus of claim 14, wherein:
    the light-emitting device comprising a pixel electrode, an opposite electrode on the pixel electrode, and an intermediate layer including an emission layer between the pixel electrode and the opposite electrode; and
    a distance between the first conductive layer and the opposite electrode is about 5 μm to about 20 μm.

17. A display apparatus comprising:
    a substrate;
    a pixel electrode on the substrate;
    an intermediate layer arranged on the pixel electrode and comprising an emission layer;
    an opposite electrode on the intermediate layer;
    a thin-film encapsulation layer on the opposite electrode and comprising an inorganic encapsulation layer and an organic encapsulation layer located on the inorganic encapsulation layer, wherein the organic encapsulation layer has a permittivity of about 2.6 or less; and
    a touch unit directly on the thin-film encapsulation layer and comprising a conductive layer configured to detect an external input.

18. The display apparatus of claim 17, wherein the organic encapsulation layer comprises an organic encapsulation material and a plurality of organic particles having a core-shell structure that includes a hollow core and a shell surrounding the hollow core.

19. The display apparatus of claim 17, wherein the organic particles comprise at least one compound selected from an acrylic polymer, polyimide, an urethane polymer, a styrene-based polymer, a siloxane-based polymer, and an epoxy-based polymer.

20. The display apparatus of claim 18, wherein a surface of the shell is electrically neutral.

21. A thin-film encapsulation layer for a display apparatus comprising:

at least one inorganic encapsulation layer; and
at least one organic encapsulation layer;
wherein the at least one organic encapsulation layer includes:
  an organic encapsulation material comprising a monomer-based organic material, and
  a plurality of organic particles having a core-shell structure that includes a hollow core and a shell surrounding the hollow core;
wherein the organic particles are included in the organic encapsulation layer at a percentage of about 10% to about 80% of a volume of the organic encapsulation material.

* * * * *